United States Patent [19]

Gross

[11] 4,399,515
[45] Aug. 16, 1983

[54] SELF-CORRECTING ELECTRONICALLY SCANNED PRESSURE SENSOR

[75] Inventor: Chris Gross, Yorktown, Va.

[73] Assignee: The United States of America as represented by the Administrator of the National Aeronautics and Space Administration, Washington, D.C.

[21] Appl. No.: 249,304

[22] Filed: Mar. 31, 1981

[51] Int. Cl.³ ............................................. G06F 15/20
[52] U.S. Cl. .................................... 364/571; 364/557; 364/558; 73/714
[58] Field of Search ...................... 364/571, 557, 558; 73/708, 714

[56] References Cited

U.S. PATENT DOCUMENTS

| | | | |
|---|---|---|---|
| 3,095,735 | 7/1963 | Menzel | 73/147 |
| 3,135,861 | 6/1964 | Burggren et al. | 364/571 X |
| 3,532,869 | 10/1970 | Talmo | 364/571 X |
| 3,689,748 | 9/1972 | Bothne | 73/388 X |
| 3,790,910 | 2/1974 | McCormack | 364/571 X |
| 3,841,150 | 10/1974 | Pearson | 73/398 AR X |
| 3,965,744 | 6/1976 | Gutjahr | 73/393 |
| 4,111,058 | 9/1978 | Gross | 73/714 |
| 4,192,005 | 3/1980 | Kurtz | 364/571 |
| 4,254,469 | 3/1981 | Whitely | 364/571 |
| 4,263,655 | 4/1981 | Chappell, Jr. | 364/558 |

OTHER PUBLICATIONS

A Microprocessor Controlled Pressure Scanning System; R. C. Anderson, Conference Proceedings of the 22nd International Instrumenation Symposium, San Diego, CA 25-27 May, 1976, pp. 685-693.

Primary Examiner—Edward J. Wise
Attorney, Agent, or Firm—Howard J. Osborn; John R. Manning; William H. King

[57] ABSTRACT

This invention is a multiple channel high data rate pressure sensing device for use in wind tunnels, spacecraft, airborne, process control, automotive, etc., pressure measurements. This device offers data rates in excess of 100,000 measurements per second with inaccuracies from temperature shifts less than 0.25% (nominal) of full scale over a temperature span of 55° C. This device consists of thirty-two solid state sensors 11, signal multiplexing electronics to electronically address each sensor, and ditital electronic circuitry to automatically correct the inherent thermal shift errors of the pressure sensors and their associated electronics.

6 Claims, 3 Drawing Figures

SELF-CORRECTING ELECTRONICALLY SCANNED PRESSURE SENSOR

ORIGIN OF THE INVENTION

The invention described herein was made by an employee of the United States Government and may be used by or for the Government for governmental purposes without the payment of any royalties thereon or therefor.

BACKGROUND OF THE INVENTION

The invention relates generally to pressure sensors and more specifically concerns apparatus for correcting thermal errors in multiple pressure sensor systems.

The major impediment of the widespread use of semiconductor type pressure sensors in the past has been their sensitivity to temperature. This sensitivity to temperature manifests itself as errors that result from changes in zero offset (voltage offset at zero pressure) and in pressure sensitivity. The errors can be reduced by the use of compensating elements or through "in situ" calibration (U.S. Pat. No. 4,111,058), but only at the expense of size, cost, or complexity. The compensating elements are often larger than the pressure sensing elements and require extensive calibration of the pressure sensors before the proper compensating elements can be chosen, thus adding significantly to the cost. Also, because the thermal zero shift is often very non-linear with temperature, compensating elements generally only are able to reduce the errors to 0.5% full scale per 55° C. For pressure sensors that can be calibrated "in situ," the calibration mechanism is as large as the pressure sensing module and requires pneumatic multiplexing and the generation and accurate measurement of the calibration pressures as well as automatic data processing equipment to compute and store the calibration coefficients.

It is the primary object of this invention to provide a pressure sensing device that largely overcomes the drawbacks of the above mentioned systems.

Another object of this invention is to provide a pressure sensing device that will accommodate multiple pressures, have a high data rate, and high accuracy through the use of analog and digital electronic circuitry that will automatically correct for errors resulting from temperature changes.

Other objects and advantages will become apparent hereinafter in the specifications and drawings.

SUMMARY OF THE INVENTION

The invention consists essentially of a plurality of solid state pressure sensors, signal multiplexing electronics that allow each of the pressure sensors to be digitally addressed, and solid state memory components and their associated electronics that have stored in them a digital code that will correct for errors resulting from temperature changes (zero offset and pressure sensitivity) in each of the pressure sensors. Through the use of this invention, the errors resulting from temperature shifts can be reduced from typical values of 5% to less than 0.15% for a 55° C. temperature range.

DETAILED DESCRIPTION OF THE INVENTION

Figure 1:
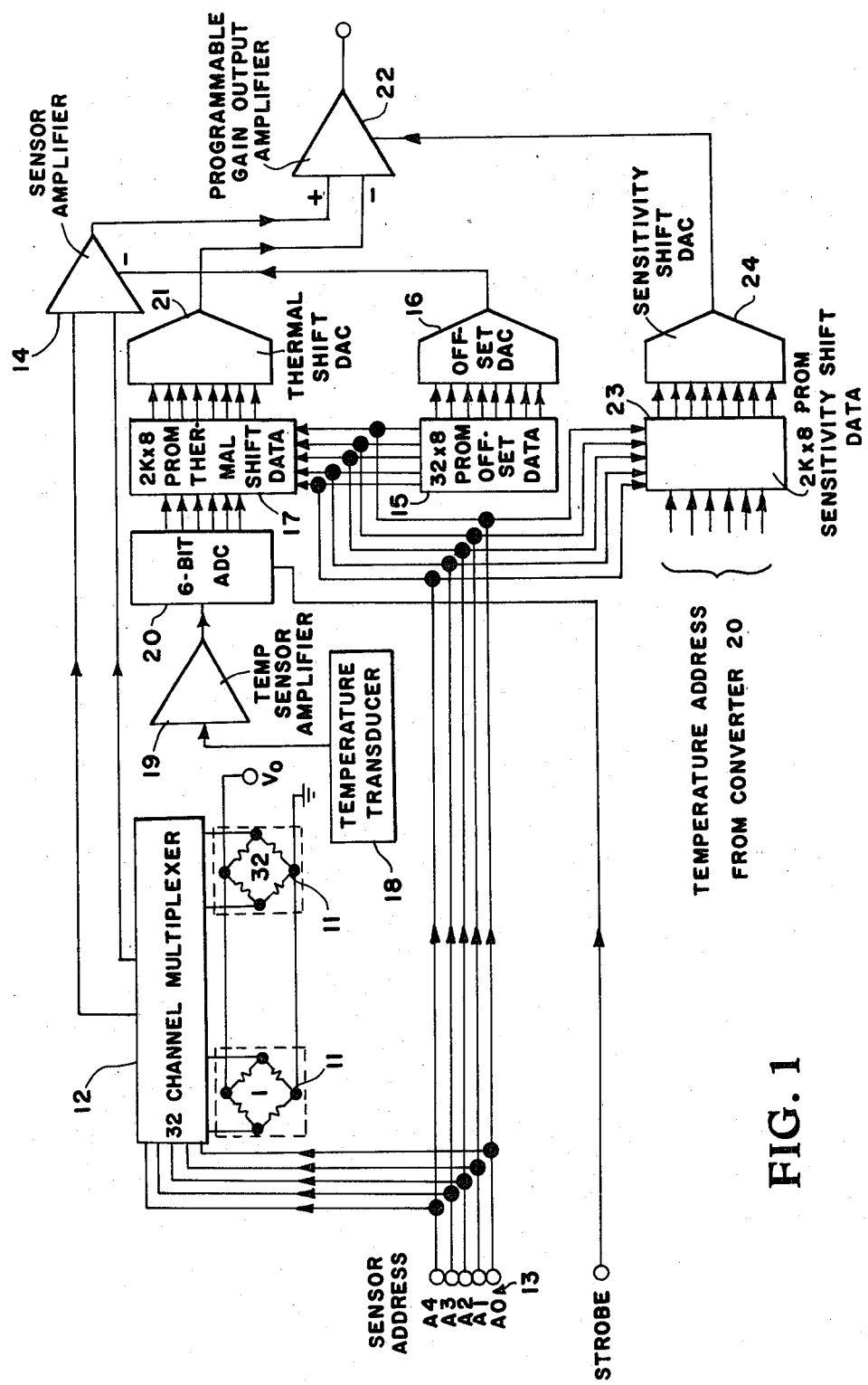
FIG. 1 is a block diagram of an embodiment of the invention.

Turning now to the embodiment of the invention selected for illustration in the drawings, the number 11 in FIG. 1 designates thirty-two different pressure sensors. Silicon diaphram pressure sensors of the diffused Wheatstone Bridge type are used and connected in parallel with common excitation nodes—one connected to ground and the other connected to a voltage source $V_o$. Each of the sensors 11 produces a voltage at its output that is related to the pressure at its location. The outputs from all the sensors 11 are connected to a thirty-two channel multiplexer 12. A sensor address 13 including terminals $A_0$, $A_1$, $A_2$, $A_3$, $A_4$ applies digital signals to multiplexer 12 to sequentially connect the sensors 11 to the output of the multiplexer and then to a sensor amplifier 14. If the voltage V at the output of sensor amplifier 14 were related to the pressure P applied to the different sensors 11 in accordance with the following equation:

$$P = kV \qquad (1)$$

where k is a constant that is the same for all thirty-two sensors there would be no problem—the output of amplifier 14 would be proportional to the pressure at all thirty-two locations. Unfortunately, commercially available pressure sensors are not that uniform. The output of sensors 11 are related to the first order to the pressure applied to the sensors in accordance with the following equation:

$$P = a_i(T) + b_i(T)V_i \qquad (2)$$

where $i = 1, 2, \ldots 32$ corresponds to one of the thirty-two sensors 11 and where $a_i(T)$ and $b_i(T)$ are functions of the temperature T. It is the purpose of this invention to reduce the thirty-two curves defined by equation (2) to the straight lines defined in equation (1).

Consider first the $a_i(T)$ term in equation (2). If zero pressure is applied to each of the sensors 11, and the voltage V is measured as the temperature T is varied, each of the sensors will have a V versus T curve similar to the one shown in FIG. 2. Inasmuch as $a_i(T)$ does not change with pressure this curve will remain substantially the same for all values of pressure. If the $a_i(T)$ is determined at the output of amplifier 14 for each sensor 11 and is subtracted from the corresponding equation (2) then the resulting outputs of these sensors will be related to the pressure applied to the sensors in accordance with the following equation:

$$P_i = b_i V_i \qquad (3)$$

Figure 2:
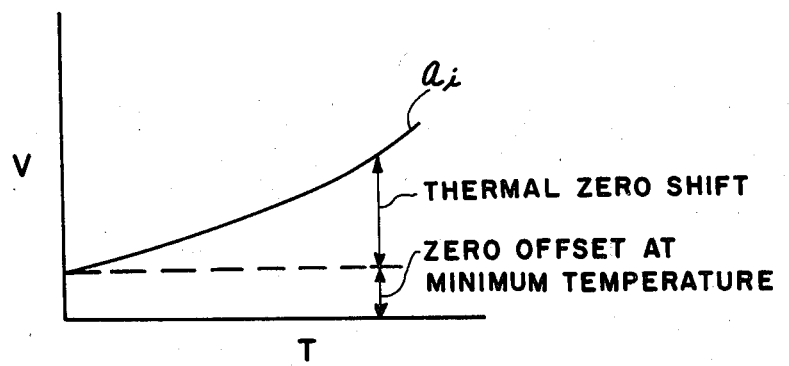
FIG. 2 is a voltage versus temperature at zero pressure graph of the pressure sensors used.

To implement the portion of this invention that eliminates the $a_i(T)$ term note in FIG. 2 that at the minimum temperature in the temperature range (for example, 25° C. to 80° C.) the voltage V is not zero. That is, there is a zero offset voltage at minimum temperature. A digital code which when converted to analog is equal to the zero offset voltage at minimum temperature is programmed into a 32×8 programmable read only memory (PROM) 15. Each sensor can have and probably will have a different zero offset voltage at minimum temperature. The sensor address is applied to PROM 15 which sequentially applies the digital code in the form of an 8-bit digital output to a digital-to-analog converter 16. The analog output of converter 16 is applied to a summing node in sensor amplifier 14 which subtracts the offset voltage from the corresponding sensor 11 output.

The thermal zero shift values are programmed into a 2K×8 PROM 17. These thermal zero shift values can be measured at sixty-four equally spaced temperature locations throughout the temperature range or the values can be measured at a smaller number of locations and interpolations made to determine the values at the other locations. A temperature transducer 18 produces a voltage proportional to temperature which is applied through a temperature sensor amplifier 19 to a 6-bit analog-to-digital converter 20. A strobe is applied to converter 20 to produce a 6-bit thermal address. The thermal address and the sensor address are applied to PROM 17 to select the appropriate thermal zero shift data which is connected to an 8-bit temperature shift digital-to-analog converter 21. The resulting analog signal is applied to the negative input of a differential input programmable gain output amplifier 22 where it is subtracted from the output of sensor amplifier 14. Note that if the gain of amplifier 22 is constant (for example, one), the output of amplifier 14 is fitted to equation (3) to the resolution of the electronic correction circuitry. That is, the $a_i(T)$ term is reduced by a factor of $2^8$ or 1/256 of its initial value.

It should be appreciated that PROM 15, converter 16 and the summing node of amplifier 14 can be eliminated, in which case, the zero offset at minimum temperature plus the thermal zero shifts would be programmed into PROM 17. However, with the circuitry shown the resolution of the data stored in PROM 17 is improved, thereby resulting in a more accurate instrument.

Now if $b_i(T)$ in equation (3) can be made to equal some constant k which is the same for all sensors 11 then the output would be in accordance with equation (1). The $b_i(T)$ varies with the pressure sensitivity of the different sensors which varies with temperature. Hence, the sensitivities of the different sensors 11 are determined over the temperature operating range and the sensitivity correction values are programmed into a 2K×8 PROM 23. The different sensitivities are selected by the sensor address and the temperature address and applied to a digital-to-analog converter 24. The analog output of converter 24 is applied to amplifier 22 to adjust its gain such that the product of the gain and the sensitivity is exactly equal to 1 or to some other constant k. Values corresponding to the reciprocals of the sensitivities could be stored in the PROM 23 in which case the gain of amplifier 22 is varied directly instead of inversely as in the case when the sensitivity correction values are stored in PROM 23. The output of amplifier 22 is now reduced to equation (1) for all sensors 11.

Figure 3:
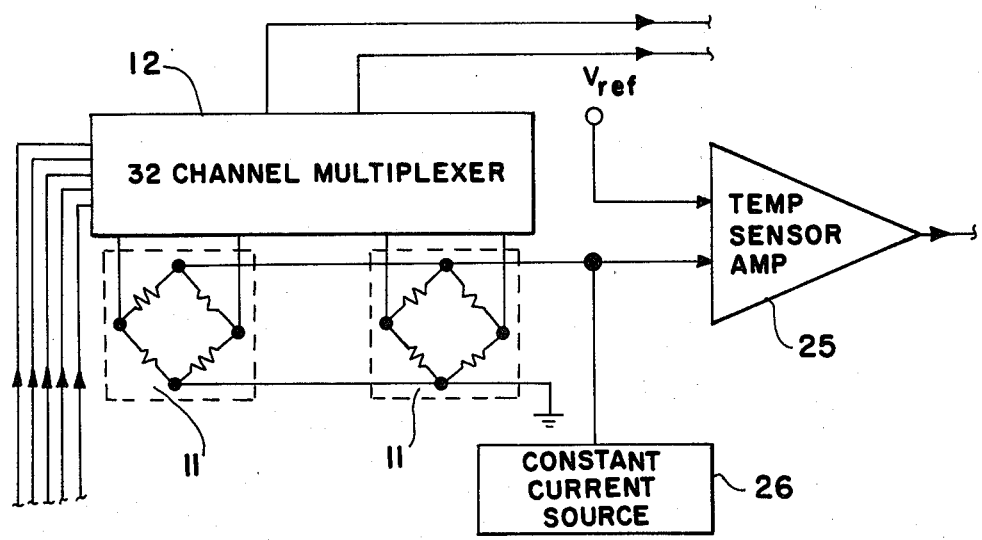
FIG. 3 is a partial block diagram of an alternate embodiment of the invention that contemplates for the pressure sensitivity of the pressure sensors.

In an alternate embodiment of the invention shown in FIG. 3, the thirty-two pressure sensors 11 are silicon diaphragm pressure sensors of the diffused Wheatstone Bridge type. The two excitation voltage points of the sensors are connected in parallel with one side connected to ground and the other side connected to a constant current source 26. The constant current source provides the excitation voltage for the pressure sensors as well as provides for thermal sensitivity compensations and a voltage proportional to temperature. These two latter features result in the following manner: The silicon diaphragm pressure sensors used in this embodiment have a thermal coefficient of resistance of the same magnitude and opposite sign of the thermal coefficient of sensitivity. The voltage proportional to temperature is applied to a temperature sensor amplifier 25 which has a voltage reference $V_{ref}$ applied to one of its inputs. The embodiment of the invention in FIG. 3 can be used with or without the sensitivity correcting circuitry. When used with the sensitivitiy correcting circuitry, the resolution of PROM 23 is increased thereby increasing the accuracy of the instrument.

PROMs and programmable amplifiers are well known and are therefore not disclosed in detail in this specification.

The advantages of this invention is that it provides a simple high accuracy technique for correcting thermal errors in pressure sensors without the complexities of in situ calibration or post data correction. The invention offers data rates in excess of 100,000 measurements per second with inaccuracies from temperature drifts less than 0.15% of full scale over a temperature space of 55° C.

It is to be understood that the form of the invention herewith shown and described is to be taken as a preferred embodiment. Various changes may be made without departing from the invention. For example, PROM 17 can be used with or without PROM 15, PROM 23 can be used or it can be eliminated and PROM 23 can be used with or without the embodiment shown in FIG. 3.

What is claimed is:

1. In a multiple pressure sensor system, means for correcting thermal errors in the analog outputs of the pressure sensor comprising:

a plurality of pressure sensors;

means including a digital address for sequentially connecting said pressure sensors to an output terminal;

means for producing a voltage proportional to temperature;

analog-to-digital converter means for converting said voltage proportional to temperature to a digital temperature address;

digital storage means for storing the thermal shift correction values generated by each of said pressure sensors throughout the temperature operating range of said pressure sensor system and responsive to said digital sensor address and said digital thermal address for selecting the digital thermal shift value corresponding to the temperature and the pressure sensor connected to said output terminal;

digital-to-analog converter means for converting the selected digital thermal shift value to an analog thermal shift signal;

means for combining said analog thermal shift signal with the output of the corresponding pressure sensor to compensate for the thermal shift of the pressure sensor; and means for providing thermal sensitivity compensations for the different pressure sensor outputs.

2. In a multiple pressure sensor system according to claim 1 including a digital storage means for storing the zero offset values of each of said pressure sensors and responsive to said digital sensor address for selecting the zero offset corresponding to the pressure sensor connected to said output terminal; digital-to-analog converter means for converting the selected zero offsets to a zero offset analog signal; and means for combining said zero offset analog signal with the output of the corresponding pressure sensor.

3. In a multiple pressure sensor system according to claim 1 or claim 2 wherein said means for providing thermal sensitivity compensations includes a digital storage means for storing values related to the sensitivities of the pressure sensors throughout the temperature operating range of said pressure sensor system and responsive to said digital sensor address and said digital thermal address for selecting the digital value corresponding to the sensitivity of the pressure sensor connected to said output terminal; digital-to-analog converter means for converting the selected digital value to an analog signal; and means responsive to said analog signal for applying a gain to the signal at said output terminal so that the product of the gain and the sensitivity is a constant.

4. In a multiple pressure sensor system according to claim 1 or claim 2 wherein said means for producing a voltage proportional to temperature is a temperature transducer.

5. In a multiple pressure sensor system according to claim 1 or claim 2 wherein said means for providing thermal sensitivity compensations is the pressure sensors having a thermal coefficient of resistance of the same magnitude and opposite sign of the thermal coefficient of sensitivity and a constant current source connected to said pressure sensors whereby whenever there is a change in temperature the resulting change in the output of a sensor offsets the change in sensitivity with temperature thereby resulting in a nearly constant pressure sensitivity with temperature.

6. In a multiple pressure sensor system according to claim 1 or claim 2 wherein said means for providing thermal sensitivity compensations include a digital storage means for storing values related to the sensitivities of the pressure sensors throughout the temperature operating range of said pressure sensor system and responsive to said digital sensor address and said digital thermal address for selecting the digital value corresponding to the sensitivity of the pressure sensor connected to said output terminal; digital-to-analog converter means for converting the selected digital value to an analog signal; means for applying a gain to the signal at said output terminal so that the product of the gain and the sensitivity is a constant; said pressure sensors have a thermal coefficient of resistance of the same magnitude and opposite sign of the thermal coefficient of sensitivity; and a constant current source connected to said pressure sensors.

* * * * *